(12) United States Patent
Masuda et al.

(10) Patent No.: US 10,014,376 B2
(45) Date of Patent: Jul. 3, 2018

(54) SILICON CARBIDE SEMICONDUCTOR DEVICE HAVING A TRENCH WITH SIDE WALLS AND METHOD FOR MANUFACTURING SAME

(71) Applicant: Sumitomo Electric Industries, Ltd., Osaka-shi (JP)

(72) Inventors: Takeyoshi Masuda, Osaka (JP); Hideto Tamaso, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 57 days.

(21) Appl. No.: 14/912,433

(22) PCT Filed: Jul. 16, 2014

(86) PCT No.: PCT/JP2014/068881
§ 371 (c)(1),
(2) Date: Feb. 17, 2016

(87) PCT Pub. No.: WO2015/033674
PCT Pub. Date: Mar. 12, 2015

(65) Prior Publication Data
US 2016/0204206 A1    Jul. 14, 2016

(30) Foreign Application Priority Data
Sep. 6, 2013 (JP) .................................. 2013-184813

(51) Int. Cl.
*H01L 29/78* (2006.01)
*H01L 29/16* (2006.01)
(Continued)

(52) U.S. Cl.
CPC ........ *H01L 29/1608* (2013.01); *H01L 21/049* (2013.01); *H01L 21/0475* (2013.01); *H01L 29/045* (2013.01); *H01L 29/0696* (2013.01); *H01L 29/4236* (2013.01); *H01L 29/66068* (2013.01); *H01L 29/7813* (2013.01)

(58) Field of Classification Search
CPC ......... H01L 21/02378; H01L 21/02529; H01L 29/1602; H01L 21/02527; H01L 33/34; H01L 21/02376
See application file for complete search history.

(56) References Cited

U.S. PATENT DOCUMENTS 7,824,995 B2 * 11/2010 Endo ..................... H01L 21/049
438/197
8,395,162 B2 * 3/2013 Nakano ................. H01L 21/046
257/49
(Continued)

FOREIGN PATENT DOCUMENTS

JP    2007-080971 A    3/2007
JP    2008-235546 A    10/2008
(Continued)

OTHER PUBLICATIONS

International Search Report in International Application No. PCT/JP2014/068881, dated Oct. 7, 2014.

*Primary Examiner* — Benjamin Sandvik
(74) *Attorney, Agent, or Firm* — Venable LLP; Michael A. Sartori; Kerri M. Patterson

(57) ABSTRACT

A silicon carbide semiconductor device includes: a silicon carbide off substrate including a main surface having an off angle relative to a basal plane, the main surface being provided with a trench, the trench having a plurality of side walls and a bottom portion; a gate insulating film covering the side walls and the bottom portion; and a gate electrode provided on the gate insulating film, each of the side walls having an angle of more than 65° and not more than 80° relative to the basal plane in the trench, opening directions of the plurality of side walls being all at a silicon plane side or a carbon plane side.

15 Claims, 8 Drawing Sheets

(51) Int. Cl.
    *H01L 21/04*     (2006.01)
    *H01L 29/423*     (2006.01)
    *H01L 29/66*     (2006.01)
    *H01L 29/04*     (2006.01)
    *H01L 29/06*     (2006.01)

(56) References Cited

U.S. PATENT DOCUMENTS

| | | | | |
|---|---|---|---|---|
| 8,502,236 | B2* | 8/2013 | Harada | H01L 21/049 257/173 |
| 8,872,280 | B2* | 10/2014 | Tsai | H01L 29/66795 257/401 |
| 9,006,747 | B2* | 4/2015 | Hatayama | H01L 21/3065 257/77 |
| 9,012,922 | B2* | 4/2015 | Hiyoshi | H01L 21/3065 257/77 |
| 2007/0057262 | A1 | 3/2007 | Nakamura et al. | |
| 2008/0230787 | A1 | 9/2008 | Suzuki et al. | |
| 2010/0062582 | A1* | 3/2010 | Fujikawa | H01L 29/66068 438/430 |
| 2011/0186862 | A1 | 8/2011 | Harada et al. | |
| 2012/0181551 | A1* | 7/2012 | Miyahara | H01L 21/0475 257/77 |
| 2012/0309195 | A1* | 12/2012 | Masuda | H01L 29/045 438/701 |
| 2013/0062629 | A1 | 3/2013 | Hiyoshi et al. | |

FOREIGN PATENT DOCUMENTS

| | | | | |
|---|---|---|---|---|
| JP | 2009-158933 | A | 7/2009 | |
| JP | 2012-146921 | A | 8/2012 | |
| JP | WO 2013031172 | A1 * | 3/2013 | H01L 21/3065 |
| WO | WO-2013/038860 | A1 | 3/2013 | |

* cited by examiner

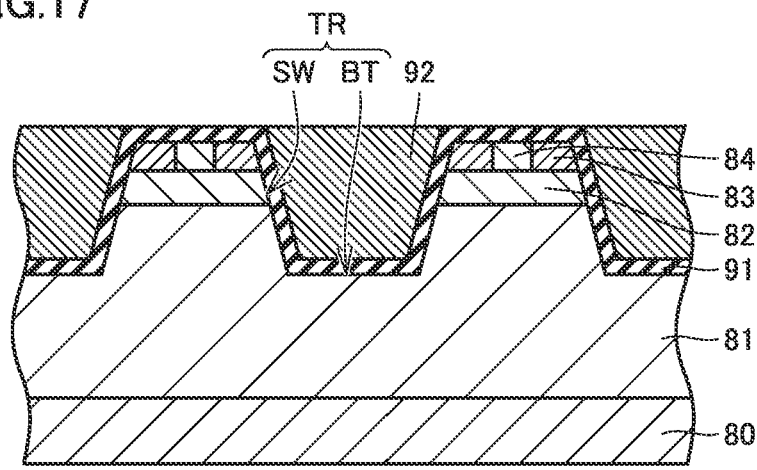
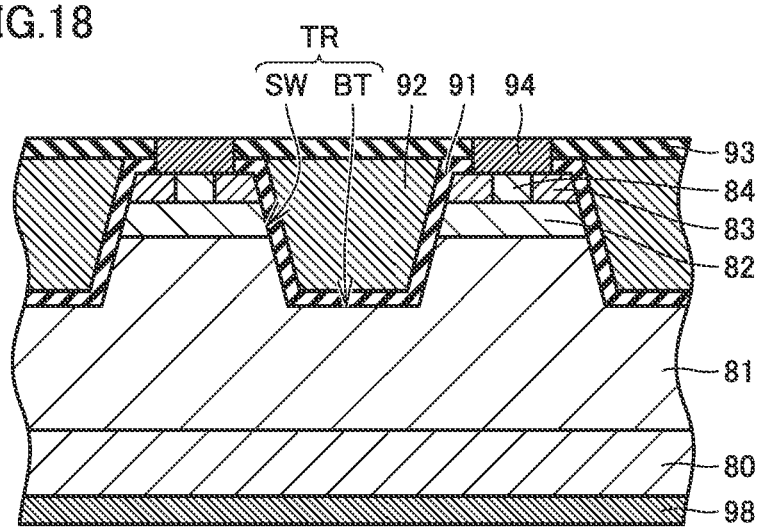

US 10,014,376 B2

SILICON CARBIDE SEMICONDUCTOR DEVICE HAVING A TRENCH WITH SIDE WALLS AND METHOD FOR MANUFACTURING SAME

TECHNICAL FIELD

The present invention relates to a silicon carbide semiconductor device.

BACKGROUND ART

As compared with silicon semiconductor devices currently mainly used, a silicon carbide semiconductor device has many advantages such as small power loss and operability under a high temperature, and is expected as a next-generation power semiconductor device. Conventionally, various structures have been proposed for structures of semiconductor devices. For example, in a trench gate structure, a groove called "trench" is provided in a semiconductor substrate (for example, see Japanese Patent Laying-Open No. 2012-146921 (Patent Document 1)).

CITATION LIST

Patent Document

PTD 1: Japanese Patent Laying-Open No. 2012-146921

SUMMARY OF INVENTION

Technical Problem

In the trench gate structure, a channel region is formed along a side wall of the trench. That is, the channel region is formed in the longitudinal direction of the semiconductor device (direction perpendicular to the surface of the substrate). This allows for fine structure and high integration of the semiconductor device.

Meanwhile, for epitaxial growth, a silicon carbide semiconductor substrate generally has a main surface having a predetermined off angle relative to a basal plane (for example, a (0001) plane). Accordingly, when a trench is provided in the surface of the silicon carbide semiconductor substrate, two side walls facing each other in the trench normally have different plane orientations.

Such a difference in plane orientation between the side walls facing each other leads to a difference in electric property (channel mobility) between respective channel regions formed along the side walls. This causes imbalance in current between the side walls facing each other, with the result that reliability of the silicon carbide semiconductor device may be decreased in long-term use. This is because current preferentially flows in a portion having a low resistance and the current is therefore concentrated on a channel region formed along one side wall.

In order to address such a problem, in Patent Document 1, the trench is defined to extend in a direction having a predetermined angle relative to the off direction of the substrate, thereby suppressing the plane orientations of the side walls facing each other from being different from each other.

However, silicon carbide semiconductor devices are required to attain higher integration. According to the method of Patent Document 1, the position of the trench is uniquely determined with respect to the off direction of the substrate, thus resulting in a small degree of freedom in design. This may be a restraint for high integration of silicon carbide semiconductor devices.

In view of the above-described problem, it is an object to provide a highly reliable silicon carbide semiconductor device allowing for high integration.

Solution to Problem

A silicon carbide semiconductor device according to one embodiment of the present invention includes: a silicon carbide off substrate including a main surface having an off angle relative to a basal plane. Here, the main surface is provided with a trench, and the trench has a plurality of side walls and a bottom portion. The silicon carbide semiconductor device further includes: a gate insulating film covering the side walls and the bottom portion; and a gate electrode provided on the gate insulating film.

Each of the side walls has an angle of more than 65° and not more than 80° relative to the basal plane in the trench, and opening directions of the plurality of side walls are all at a silicon plane side or a carbon plane side.

Advantageous Effects of Invention

The silicon carbide semiconductor device is highly reliable while allowing for high integration.

BRIEF DESCRIPTION OF DRAWINGS

FIG. 17 is a partial cross sectional view schematically showing part of the process of manufacturing the silicon carbide semiconductor device according to the one embodiment of the present invention.

FIG. 18 is a partial cross sectional view schematically showing part of the process of manufacturing the silicon carbide semiconductor device according to the one embodiment of the present invention.

DESCRIPTION OF EMBODIMENTS

Figure 1:
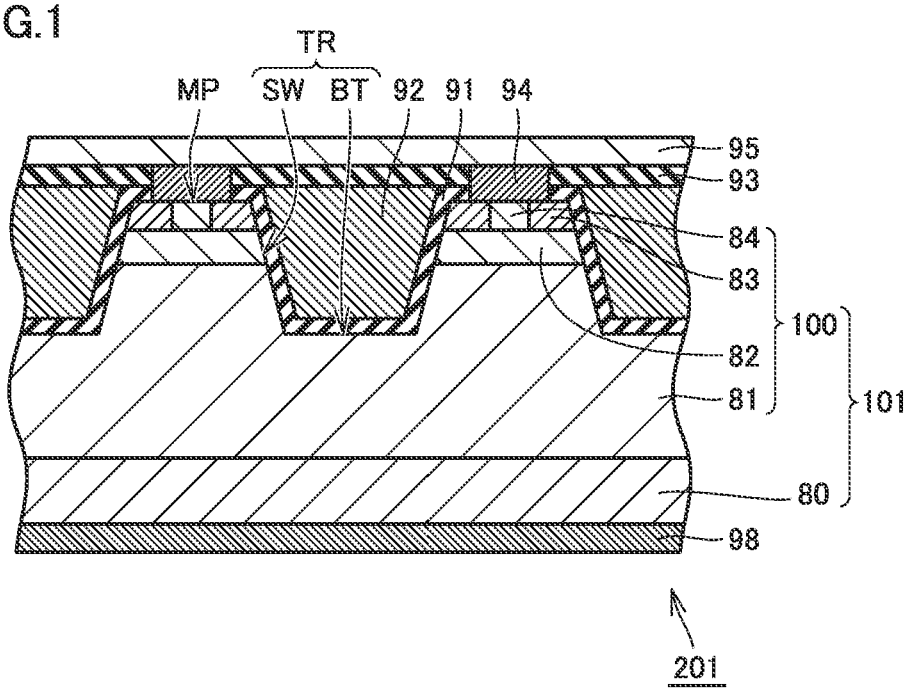
FIG. 1 is a partial cross sectional view taken along a line I-I of FIG. 2 or a line I-I of FIG. 3, and schematically shows an exemplary configuration of a silicon carbide semiconductor device according to one embodiment of the present invention.

The following describes one embodiment according to the present invention more in detail. It should be noted that in the below-described figures, the same or corresponding portions are given the same reference characters and are not described repeatedly. Regarding crystallographic indications in the present specification, an individual orientation is represented by [ ], a group orientation is represented by < >, and an individual plane is represented by ( ), and a group plane is represented by { }. In addition, a negative crystallographic index is normally expressed by putting "−" (bar) above a numeral, but is expressed by putting the negative sign before the numeral in the present specification.

Description of Embodiment of the Invention of the Present Application

First, the overview of one embodiment of the present invention (hereinafter also referred as "the present embodiment") will be listed in (1) to (14) below for the purpose of explanation.

The present inventor conducted diligent study to solve the above-described problem, and accordingly obtained the following knowledge: when a trench is formed to have side walls each having a specific angle relative to a basal plane, channel regions formed at the side walls facing each other can have substantially equivalent characteristics. Based on this knowledge, research was further conducted to complete the present embodiment. That is, a silicon carbide semiconductor device according to the present embodiment includes the following configuration.

(1) A silicon carbide semiconductor device 201 according to the present embodiment includes: a silicon carbide off substrate 101 including a main surface MP having an off angle θ relative to a basal plane. Here, main surface MP is provided with a trench TR, and trench TR has a plurality of side walls SW and a bottom portion BT. Silicon carbide semiconductor device 201 further includes: a gate insulating film 91 covering side walls SW and bottom portion BT; and a gate electrode 92 provided on gate insulating film 91.

Each of side walls SW has an angle θ1, θ2 of more than 65° and not more than 80° relative to the basal plane in trench TR, and opening directions of the plurality of side walls SW are all at a silicon plane side or a carbon plane side.

It should be noted that the basal plane herein refers to a (0001) plane or a (000-1) plane. Moreover, the "silicon plane" refers to the (0001) plane, and the "carbon plane" refers to the (000-1) plane, and the "silicon plane" may be described as "Si plane" and the "carbon plane" may be described as "C plane" in the description below.

Figure 4:
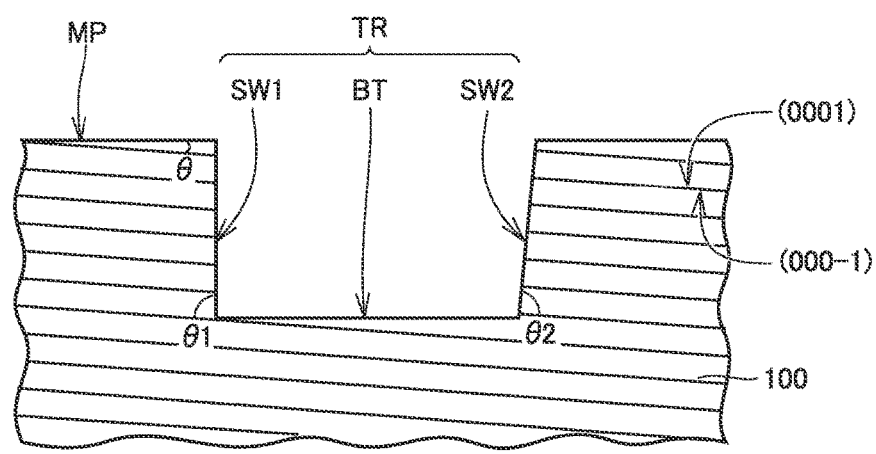
FIG. 4 is a partial cross sectional view schematically showing an exemplary shape of a trench according to the one embodiment of the present invention.

Furthermore, with reference to FIG. 4, the expression "the opening directions of side walls SW are at the silicon plane side" indicates that angle θ1, θ2 between the (0001) plane and each of side walls SW is not less than 0° and less than 90°, and the expression "the opening directions of side walls SW are at the carbon plane side" indicates that angle θ1, θ2 between the (000-1) plane and each of side walls SW is not less than 0° and less than 90°.

According to silicon carbide semiconductor device 201 configured as described above, substantially equivalent crystal planes can be exposed at side walls SW of trench TR facing each other. In other words, characteristics (channel mobility) of channel regions formed along side walls SW facing each other can be substantially equivalent to each other. Accordingly, imbalance in current can be prevented in the channel regions formed at side walls SW facing each other, thereby attaining high reliability. Moreover, the position of trench TR is not restricted with regard to the off direction of silicon carbide off substrate 101, thereby attaining higher integration of silicon carbide semiconductor devices.

(2) Preferably, silicon carbide off substrate 101 has an off direction corresponding to a <11-20> direction. Such a silicon carbide off substrate having an off direction corresponding to the <11-20> direction is suitable because it can be readily obtained in the market.

(3) Preferably, off angle θ of silicon carbide off substrate 101 is not less than 1° and not more than 8°. Accordingly, silicon carbide off substrate 101 can have a small amount of crystal defects.

(4) Preferably, when viewed in a plan view, trench TR has a closed shape provided by the plurality of side walls SW continuous to one another, and all the side walls SW are covered with gate insulating film 91. Accordingly, the channel regions are formed along all the side walls SW and channel mobility in each side wall SW is substantially equivalent, thereby constructing a silicon carbide semiconductor device having more improved reliability.

(5) Preferably, the plurality of side walls SW include a first side wall SW1 and a second side wall SW2 facing each other, and a difference between an angle θ1 of first side wall SW1 relative to the basal plane and an angle θ2 of second wall SW2 relative to the basal plane is not more than off angle θ. Accordingly, the characteristic of the channel region formed along first side wall SW1 and the characteristic of the channel region formed along second side wall SW2 can be more similar to each other.

(6) Preferably, the opening directions of the plurality of side walls SW are all at the silicon plane side. Accordingly, the planes exposed at all the side walls SW can be crystal planes similar to the carbon plane, whereby a characteristic similar to that of the carbon plane can be used in all the channel regions.

(7) Preferably, a hydrogen concentration in a region within 10 nm from an interface between silicon carbide off substrate 101 and gate insulating film 91 is not less than $1 \times 10^{18}/cm^3$. Accordingly, interface states are suppressed from being formed at the interface between gate insulating film 91 and side wall SW open at the silicon plane side, thereby improving channel mobility.

(8) Preferably, the opening directions of the plurality of side walls SW are all at the carbon plane side. Accordingly, the planes exposed at all the side walls SW can be crystal planes similar to the silicon plane, whereby a characteristic similar to that of the silicon plane can be used in all the channel regions.

(9) Preferably, a nitrogen concentration in a region within 10 nm from an interface between silicon carbide off substrate 101 and gate insulating film 91 is not less than $1 \times 10^{18}/cm^3$. Accordingly, interface states are suppressed from being formed at the interface between gate insulating film 91 and side wall SW open at the carbon plane side, thereby improving channel mobility.

(10) The silicon carbide semiconductor device described above can be manufactured using the following manufacturing method. Specifically, the method for manufacturing the silicon carbide semiconductor device include: a step S1 of preparing a silicon carbide off substrate 101 having a main surface MP; a first etching step S2 of performing anisotropic etching onto main surface MP to form a trench TQ having a side wall SW and a bottom portion BT; and a second etching step S3 of performing isotropic etching onto side wall SW and bottom portion BT to provide side wall SW with an angle θ1, θ2 of more than 65° and not more than 80° relative to the basal plane.

Accordingly, the opening directions of side walls SW of trench TR facing each other can be all at the silicon plane side or the carbon plane side, thereby manufacturing a silicon carbide semiconductor device in which substantially equivalent crystal planes are exposed at side walls SW facing each other.

(11) Preferably, removal depth d1 of silicon carbide off substrate 101 attained by first etching step S2 is deeper than removal depth d2 of silicon carbide off substrate 101 attained by second etching step S3. Accordingly, substantially equivalent crystal planes can be more securely exposed at side walls SW facing each other.

(12) Preferably, first etching step S2 includes a step of etching main surface MP to provide side wall SW with an angle of not less than 80° relative to the basal plane. Accordingly, when side wall SW is removed partially by the etching in second etching step S3, the angle of side wall SW relative to the basal plane after the etching can become readily not more than 80°. Accordingly, substantially equivalent crystal planes can be more securely exposed at side walls SW facing each other.

(13) Preferably, when an opening direction of side wall SW is at a silicon plane side, the method for manufacturing the silicon carbide semiconductor device further includes: a step S4 of forming a gate insulating film 91 covering side wall SW and bottom portion BT; and a step S51 of introducing hydrogen into an interface between silicon carbide off substrate 101 and gate insulating film 91. Accordingly, interface states at the interface can be suppressed from being formed, thereby manufacturing a silicon carbide semiconductor device having improved channel mobility.

(14) Preferably, when an opening direction of side wall SW is at a carbon plane side, the method for manufacturing the silicon carbide semiconductor device further includes: a step S4 of forming a gate insulating film 91 covering side wall SW and bottom portion BT; and a step S52 of introducing nitrogen into an interface between silicon carbide off substrate 101 and gate insulating film 91. Accordingly, interface states at the interface can be suppressed from being formed, thereby manufacturing a silicon carbide semiconductor device having improved channel mobility.

Details of Embodiments of the Invention of the Present Application

Although the silicon carbide semiconductor device according to the present embodiment will be hereinafter described more in detail, the present embodiment is not limited to these.

<Silicon Carbide Semiconductor Device>

FIG. 1 is a cross sectional view schematically showing a configuration of a silicon carbide semiconductor device 201 according to the present embodiment. Silicon carbide semiconductor device 201 shown in FIG. 1 is configured as a trench gate type MOSFET (Metal Oxide Semiconductor Field Effect Transistor). Silicon carbide semiconductor device 201 has a silicon carbide off substrate 101, gate insulating films 91, gate electrodes 92, interlayer insulating films 93, source electrodes 94, a source interconnection layer 95, and a drain electrode 98. Silicon carbide off substrate 101 includes: a single crystal layer 80; and a silicon carbide layer 100 grown epitaxially on single crystal layer 80. Silicon carbide off substrate 101 has a main surface MP provided with a trench TR having side walls SW and a bottom portion BT. Further, in silicon carbide semiconductor device 201, a channel region is formed along each of side walls SW.

It should be noted that in the description below, the plurality of side walls may be collectively described as "side wall SW" and an individual side wall may be described as "first side wall SW1" or "second side wall SW2". It should be also noted that the respective conductivity types of layers, regions, or the like in the description below are just illustrative and the polarities of the layers, regions, or the like are not limited to these.

Main surface MP of silicon carbide off substrate 101 is inclined to have an off angle θ (see FIG. 4) relative to a basal plane (i.e., a (0001) plane or a (000-1) plane). Off angle θ is preferably not less than 1° and not more than 8°. This is because the crystal quality of silicon carbide layer 100 formed by epitaxial growth is accordingly increased. It should be noted that off angle θ is more preferably not less than 2° and not more than 6°, and is further preferably not less than 3° and not more than 5°. Moreover, silicon carbide off substrate 101 preferably has an off direction corresponding to a <11-20> direction. This is because such a silicon carbide off substrate having an off direction corresponding to the <11-20> direction can be readily obtained in the market.

Silicon carbide layer 100 is a silicon carbide layer grown epitaxially on single crystal layer 80. Single crystal layer 80 has n type conductivity. Silicon carbide layer 100 has a hexagonal crystal structure having polytype 4H. By employing such a crystal structure, the on resistance of silicon carbide semiconductor device 201 can be low. The upper surface of silicon carbide layer 100 constitutes main surface MP of silicon carbide off substrate 101. Silicon carbide layer 100 has an n drift layer 81, p body layers 82, n+ layers 83, and p contact regions 84.

N drift layer 81 has n type conductivity. N drift layer 81 preferably has an impurity concentration lower than that of single crystal layer 80. Here, n drift layer 81 preferably has an impurity concentration of not less than $1 \times 10^{15}$ cm$^{-3}$ and not more than $5 \times 10^{16}$ cm$^{-3}$.

P body layer 82 has p type conductivity. P body layer 82 is provided on n drift layer 81. P body layer 82 preferably has an impurity concentration of not less than $5 \times 10^{15}$ cm$^{-3}$ and not more than $2 \times 10^{18}$ cm$^{-3}$, such as about $1 \times 10^{18}$ cm$^{-3}$.

N+ layer 83 has n type conductivity. N+ layer 83 is provided on p body layer 82 such that n+ layer 83 is separated from n drift layer 81 by p body layer 82. Furthermore, p contact region 84 is provided in n+ layer 83. N+ layer 83 and p contact region 84 constitute a portion of main surface MP. Source electrode 94 is provided on and in contact with n+ layer 83 and p contact region 84.

Figure 2:
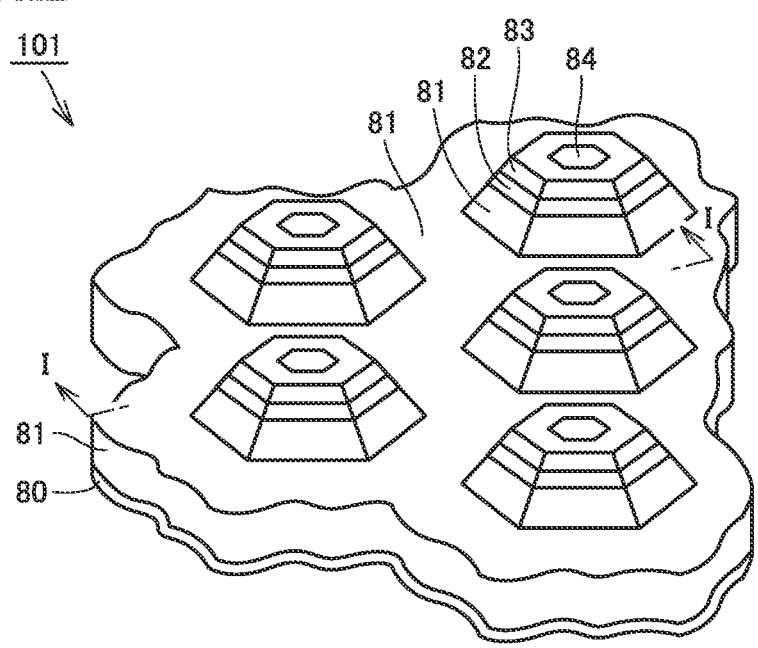
FIG. 2 is a partial perspective view schematically showing an exemplary shape of a silicon carbide layer included in the silicon carbide semiconductor device of FIG. 1.

Trench TR is provided in the upper surface of silicon carbide layer 100, i.e., main surface MP of silicon carbide off substrate 101. Here, the following describes a shape of silicon carbide layer 100 having trench TR. FIG. 2 is a partial perspective view schematically showing an exemplary shape of silicon carbide layer 100. In this example, trench TR extends to constitute a mesh of honeycomb structure, and n drift layer 81 is exposed at bottom portion BT of trench TR. The plurality of side walls SW are formed to constitute inclined surfaces of a hexagonal cone (mesa structure), and a portion of n drift layer 81, p body layer 82, and n+ layer 83 are exposed at each side wall SW. Main surface MP constitutes the top surface of the mesa structure, and has a hexagonal shape when viewed in a plan view. In the mesa structure, p contact region 84 is formed substantially at the center of the top surface and has a planar shape analogous to the hexagon (top surface). All the side walls SW are covered with gate insulating films 91 and gate electrodes 92 are provided in trench TR, whereby side walls SW at the six surfaces of the mesa structure (i.e., all the side walls SW) can be used as channel regions.

Figure 3:
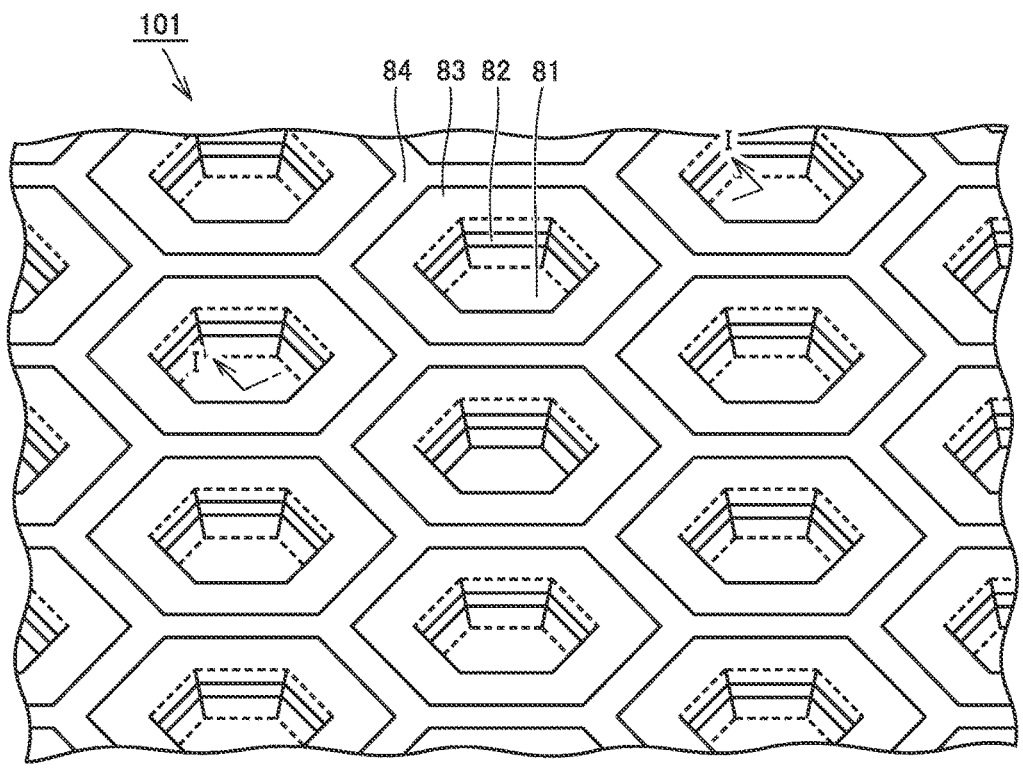
FIG. 3 is a partial perspective view schematically showing another exemplary shape of the silicon carbide layer included in the silicon carbide semiconductor device of FIG. 1.

Moreover, silicon carbide layer 100 may have a shape shown in FIG. 3. FIG. 3 is a partial perspective view schematically showing another exemplary shape of silicon carbide layer 100. In this example, main surface MP extends to constitute a mesh of honeycomb structure, and trench TR is provided in a region surrounded by main surface MP. Trench TR has a hexagonal shape when viewed in a plan view. Namely, when viewed in a plan view, trench TR has a closed shape provided by the plurality of side walls SW continuous to one another. Moreover, n drift layer 81 is exposed at bottom portion BT of trench TR, and a portion of n drift layer 81, p body layer 82, and n+ layer 83 are exposed at each of side walls SW. In this structure, all the side walls SW are covered with gate insulating film 91 and gate electrodes 92 are provided in trench TR, whereby side walls SW of the six surfaces in trench TR (i.e., all the side walls SW) can be used as channel regions.

Next, the following describes the shape of trench TR in detail. FIG. 4 is a partial enlarged view of a vicinity of trench TR in silicon carbide semiconductor device 201 shown in FIG. 1. It should be noted that in order to facilitate understanding of the shape of trench TR, gate insulating film 91, gate electrode 92, n drift layer 81, and the like are not shown in FIG. 4.

As shown in FIG. 4, trench TR has first side wall SW1 and second side wall SW2 facing each other, and bottom portion BT. Here, a group of parallel oblique lines shown in FIG. 4 represent the basal plane (the (0001) plane in this example). As shown in FIG. 4, main surface MP is inclined to have an off angle θ relative to the basal plane. Trench TR is formed such that first side wall SW1 has an angle θ1 relative to the basal plane and second side wall SW2 has an angle θ2 relative to the basal plane. In the present embodiment, angles θ1 and θ2 are more than 65° and not more than 80°. In FIG. 4, each of first side wall SW1 and second side wall SW2 is open at the (0001) plane side (i.e., the Si plane side).

Accordingly, because the opening directions of first side wall SW1 and second side wall SW2 are both at the (0001) plane side, a plane exposed at first side wall SW1 and a plane exposed at second side wall SW2 are substantially equivalent to each other, with the result that channel mobility can be substantially the same in the channel regions formed along them. Therefore, during an operation of the device, current equally flows in the channel regions, with the result that the current is not concentrated on one of the channel regions. Accordingly, high reliability can be attained.

Moreover, in the present embodiment, the angle of side wall SW is defined relative to the basal plane, so that the position of trench TR is not restricted by the off direction of the substrate. Therefore, a degree of freedom in design is high, thus contributing to higher integration of silicon carbide semiconductor devices.

It should be noted that, here, each of angles θ1 and θ2 is preferably more than 70° and not more than 80° and is further preferably more than 72° and not more than 80° such that the plane exposed at first side wall SW1 and the plane exposed at second side wall SW2 become more equivalent.

Moreover, FIG. 4 illustrates that the basal plane is the (0001) plane and first side wall SW1 and second side wall SW2 are both open at the (0001) plane side; however, the basal plane may be a (000-1) plane, and in that case, first side wall SW1 and second side wall SW2 may be both open at the (000-1) plane side (i.e., C plane side).

Further, as shown in FIG. 2 or FIG. 3 described above, silicon carbide semiconductor device 201 has the plurality of side walls SW (the plurality of first and second side walls SW1, SW2). In the present embodiment, the opening directions of the plurality of side walls SW are all at the Si plane side or the C plane side. Accordingly, in each set of first side wall SW1 and second side wall SW2 facing each other, current flows equally, thereby further attaining higher reliability.

Here, a difference between angle θ1 and angle θ2 is preferably not more than off angle θ. Thus, as the difference between angle θ1 and angle θ2 becomes smaller, a difference will be also smaller between the characteristic of the channel region formed along first side wall SW1 and the characteristic of the channel region formed along second side wall SW2.

It should be noted that in FIG. 1 and the like, bottom portion BT constitutes a surface extending in a direction crossing first side wall SW1 and second side wall SW2; however, the cross sectional shape of bottom portion BT is not limited to this and the cross sectional shape of trench TR may have a V-like shape, a U-like shape, or the like.

In the present embodiment, when the opening directions of the plurality of side walls SW are all at the Si plane side, a characteristic similar to the characteristic of the C plane can be used in all the channel regions. This is because the plane exposed at each of side walls SW becomes a crystal plane similar to the C plane. In this case, a hydrogen concentration in a region within 10 nm from an interface between silicon carbide off substrate 101 and gate insulating film 91 is preferably not less than $1 \times 10^{18}/cm^3$. This is because the introduction of hydrogen (H) into the interface between gate insulating film 91 and side wall SW having the characteristic similar to that of the C plane provides effective suppression of formation of interface states, thereby improving channel mobility. It should be noted that the hydrogen concentration is more preferably not less than $1 \times 10^{21}/cm^3$.

Moreover, in the present embodiment, when the opening directions of the plurality of side walls SW are all at the C plane side, a characteristic similar to that of the Si plane can be used in all the channel regions. This is because the plane exposed at each of side walls SW becomes a crystal plane similar to the Si plane. In this case, a nitrogen concentration in a region within 10 nm from the interface between silicon carbide off substrate 101 and gate insulating film 91 is preferably not less than $1 \times 10^{18}/cm^3$. This is because the introduction of nitrogen (N) into the interface between gate insulating film 91 and side wall SW having the characteristic similar to that of the Si plane provides effective suppression of formation of interface states, thereby improving channel mobility. It should be noted that the nitrogen concentration is more preferably not less than $1 \times 10^{21}/cm^3$.

It should be noted that each of the hydrogen concentration and the nitrogen concentration in the region within 10 nm from the interface between silicon carbide off substrate 101 and gate insulating film 91 can be measured by secondary ion mass spectroscopy (SIMS).

<Method for Manufacturing Silicon Carbide Semiconductor Device>

Figure 19:
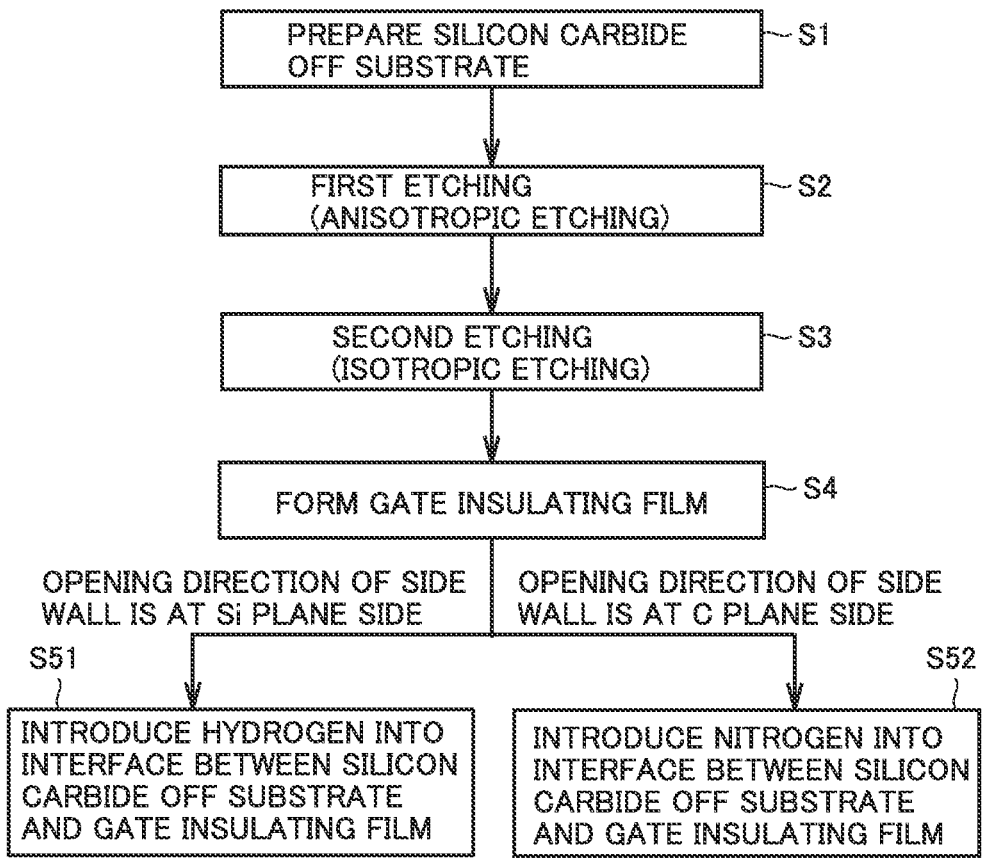
FIG. 19 is a flowchart schematically showing a method for manufacturing the silicon carbide semiconductor device according to the one embodiment of the present invention.

The silicon carbide semiconductor device of the present embodiment as described above can be manufactured using the following manufacturing method. FIG. 19 is a flowchart schematically showing the method for manufacturing the silicon carbide semiconductor device according to the present embodiment. As shown in FIG. 19, the method for manufacturing the silicon carbide semiconductor device according to the present embodiment includes a step S1, a step S2, and a step S3, and can further include a step S4 and at least one of a step S51 and a step S52 after step S4. It should be noted that this manufacturing method is also applicable to each of the structures shown in FIG. 2 and FIG. 3. Hereinafter, each of the steps will be described.

<Step S1>

In step S1, silicon carbide off substrate 101 having main surface MP is prepared. Silicon carbide off substrate 101 is prepared by forming silicon carbide layer 100 by way of epitaxial growth on single crystal layer 80 made of silicon carbide. Here, for example, single crystal layer 80 can be obtained by slicing an ingot (not shown) made of hexagonal silicon carbide of polytype 4H so as to have a predetermined off angle θ relative to the basal plane. Then, by epitaxially growing silicon carbide layer 100 on the upper surface of single crystal layer 80 having off angle θ, there can be prepared silicon carbide off substrate 101 in which the upper surface (i.e., main surface MP) of silicon carbide layer 100 has off angle θ.

Figure 5:
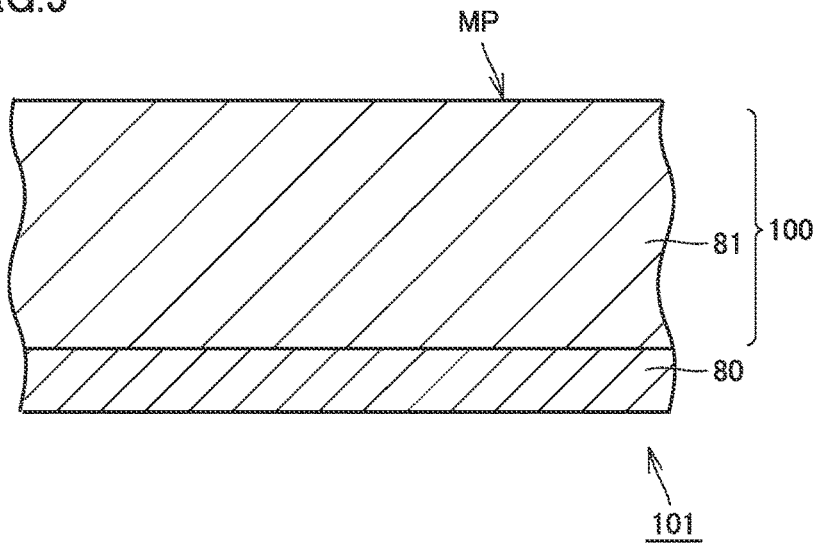
FIG. 5 is a partial cross sectional view schematically showing part of a process of manufacturing the silicon carbide semiconductor device according to the one embodiment of the present invention.

The epitaxial growth of silicon carbide layer 100 can be achieved by employing a CVD (Chemical Vapor Deposition) method that utilizes a mixed gas of silane ($SiH_4$) and propane ($C_3H_8$) as a material gas and utilizes hydrogen gas ($H_2$) as a carrier gas, for example. In doing so, it is preferable to introduce nitrogen (N) or phosphorus (P) as an impurity, for example. Accordingly, as shown in FIG. 5, n drift layer 81 is formed in silicon carbide layer 100.

Figure 6:
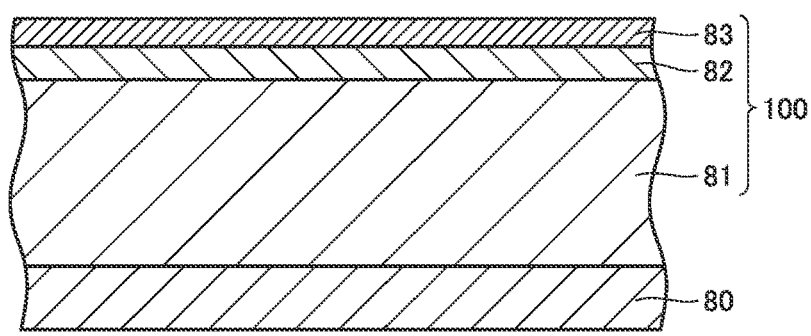
FIG. 6 is a partial cross sectional view schematically showing part of the process of manufacturing the silicon carbide semiconductor device according to the one embodiment of the present invention.

Next, as shown in FIG. 6, p body layer 82 and n+ layer 83 are formed on n drift layer 81. They can be formed by means of, for example, ion implantation into the entire surface of n drift layer 81. In the ion implantation for forming body layer 82, ions of an impurity for providing p type conductivity such as aluminum (Al) are implanted. Meanwhile, in the ion implantation for forming n+ layer 83, ions of an impurity for providing n type conductivity such as phosphorus (P) are implanted, for example. It should be noted that instead of the ion implantation, epitaxial growth involving addition of impurities may be performed.

Figure 7:
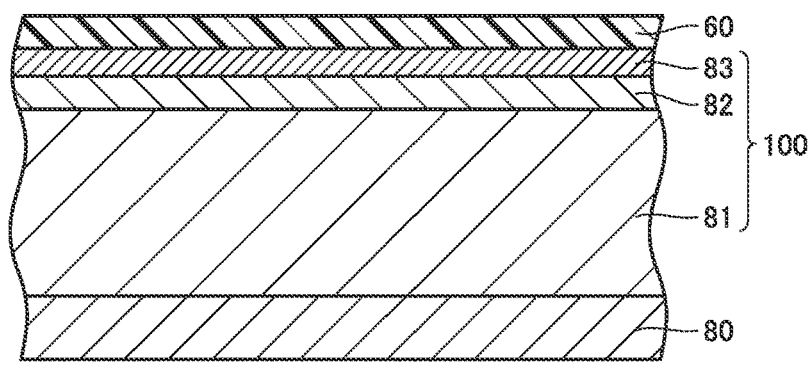
FIG. 7 is a partial cross sectional view schematically showing part of the process of manufacturing the silicon carbide semiconductor device according to the one embodiment of the present invention.
Figure 8:
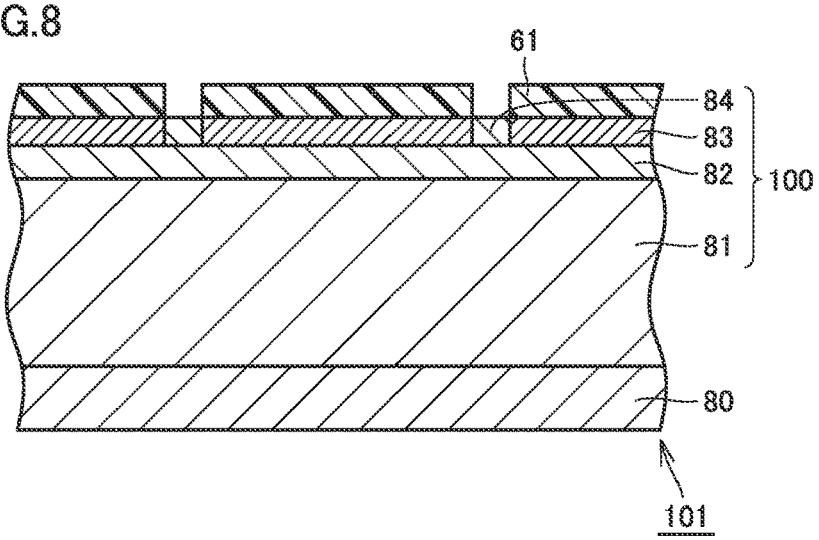
FIG. 8 is a partial cross sectional view schematically showing part of the process of manufacturing the silicon carbide semiconductor device according to the one embodiment of the present invention.
Figure 9:
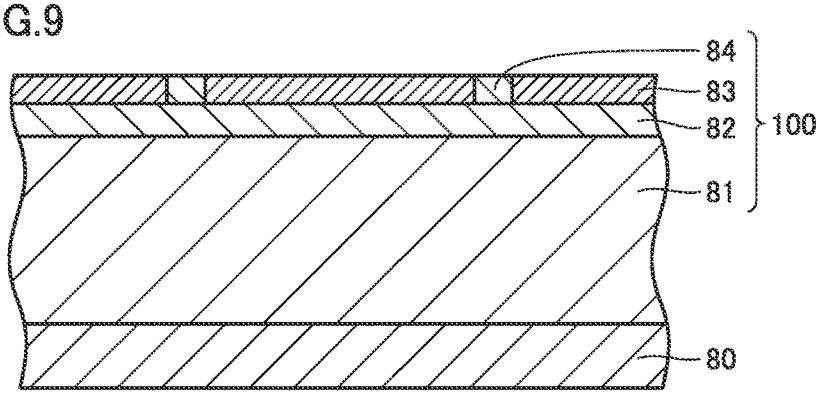
FIG. 9 is a partial cross sectional view schematically showing part of the process of manufacturing the silicon carbide semiconductor device according to the one embodiment of the present invention.

Next, as shown in FIG. 7, a resist film 60 is formed on n+ layer 83. Then, as shown in FIG. 8, resist film 60 is exposed and developed. Accordingly, a mask layer 61 is formed which has openings in conformity with locations in which p contact regions 84 are to be formed. Next, ion implantation is performed using mask layer 61 so as to form p contact regions 84. Then, as shown in FIG. 9, mask layer 61 is removed.

Next, heat treatment is performed to activate the impurities. The heat treatment on this occasion is preferably performed at a temperature of not less than 1500° C. and not more than 1900° C., for example, a temperature of approximately 1700° C. The heat treatment can be performed for about 30 minutes, for example. The atmosphere of the heat treatment is preferably an inert gas atmosphere, such as argon (Ar) atmosphere.

<Step S2>

Next, with reference to FIG. 10, FIG. 11, FIG. 12 and FIG. 13, a first etching step S2 of performing anisotropic etching onto main surface MP to form trench TQ having side walls SW and bottom portion BT is performed.

Figure 10:
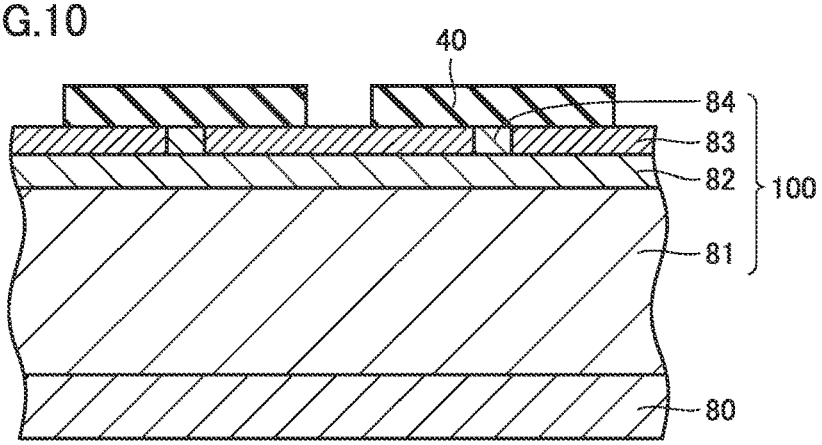
FIG. 10 is a partial cross sectional view schematically showing part of the process of manufacturing the silicon carbide semiconductor device according to the one embodiment of the present invention.
Figure 11:
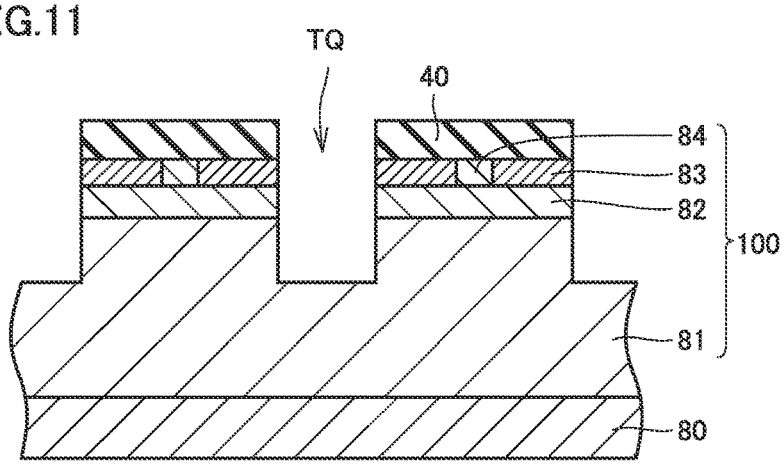
FIG. 11 is a partial cross sectional view schematically showing part of the process of manufacturing the silicon carbide semiconductor device according to the one embodiment of the present invention.

First, the overview of step S2 will be described with reference to FIG. 10 and FIG. 11. As shown in FIG. 10, a mask layer 40 having an opening is formed, by photolithography, on the surface constituted of n+ layer 83 and p contact region 84 (on main surface MP). As mask layer 40, a silicon oxide ($SiO_2$) film or the like can be used, for example. Moreover, the opening of mask layer 40 is formed corresponding to the position of trench TR. Next, anisotropic etching is performed onto main surface MP using mask layer 40, thereby forming trench TQ shown in FIG. 11.

Figure 12:
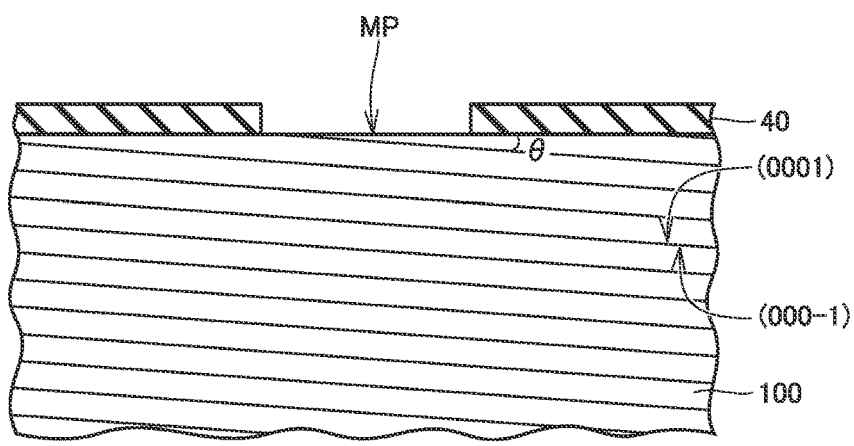
FIG. 12 is a partial cross sectional view schematically showing part of the process of manufacturing the silicon carbide semiconductor device according to the one embodiment of the present invention.
Figure 13:
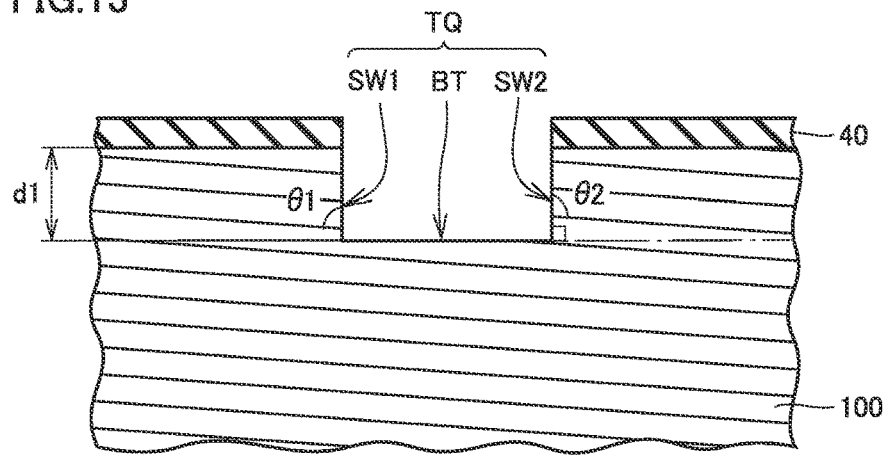
FIG. 13 is a partial cross sectional view schematically showing part of the process of manufacturing the silicon carbide semiconductor device according to the one embodiment of the present invention.

Furthermore, with reference to FIG. 12 and FIG. 13, step S2 will be described more in detail. Each of FIG. 12 and FIG. 13 is a partial enlarged view showing a vicinity of the location to be provided with trench TQ. For ease of explanation, n drift layer 81, p body layer 82, and the like are not shown in FIG. 12 and FIG. 13 and a dimensional relation and the like therein is also different from those in FIG. 10 and FIG. 11. Moreover, in FIG. 12 and FIG. 13, a group of oblique lines in silicon carbide off substrate 101 represent the basal plane. Moreover, in the following description, the basal plane is described as the (0001) plane (Si plane); however, the basal plane may be the (000-1) plane (C plane).

With reference to FIG. 12 and FIG. 13, first etching is performed by way of anisotropic etching. Exemplary, usable anisotropic etching is reactive ion etching (RIE), in particular, inductively coupled plasma (ICP) RIE. More specifically, for example, ICP-RIE can be used which employs a mixed gas of $SF_6$ and $O_2$ as a reactive gas.

With such anisotropic etching, trench TQ having side walls SW substantially along the thickness direction (longitudinal direction in FIG. 13) of silicon carbide off substrate 101 is formed. On this occasion, as shown in FIG. 13, angle θ1 between first side wall SW1 and the (0001) plane is not less than 0° and less than 90°. That is, the opening direction of first side wall SW1 is at the Si plane side. On the other hand, angle θ2 between second side wall SW2 and the (0001) plane is more than 90°. Therefore, the opening direction of second side wall SW2 is at a side opposite to the (0001) plane, i.e., is at the C plane side. In other words, in this state, first side wall SW1 and second side wall SW2 are different from each other in terms of opening direction. It should be noted that in step S2, the etching is preferably performed such that angle θ1 between first side wall SW1 of trench TQ and the basal plane becomes not less than 80°. Accordingly, in step S3 described below, substantially equivalent planes can be more likely to be exposed at first side wall SW1 and second side wall SW2.
<Step S3>

Figure 14:
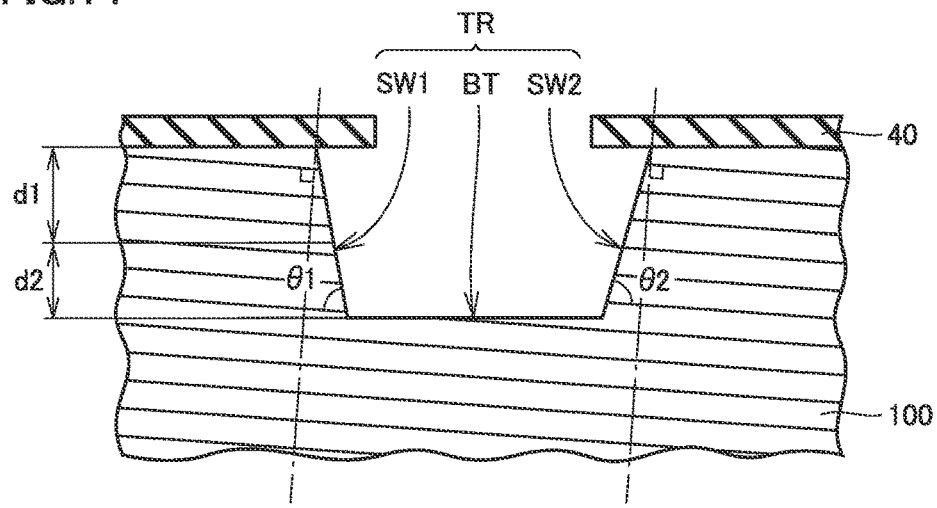
FIG. 14 is a partial cross sectional view schematically showing part of the process of manufacturing the silicon carbide semiconductor device according to the one embodiment of the present invention.

Next, as shown in FIG. 14, there is performed a second etching step S3 of performing isotropic etching onto first side wall SW1, second side wall SW2, and bottom portion BT, each of which is formed in step S2, to provide each of first side wall SW1 and second side wall SW2 with an angle of more than 65° and not more than 80° relative to the basal plane. Accordingly, the opening direction of first side wall SW1 and the opening direction of second side wall SW2 are at the same side, and the plane exposed at first side wall SW1 and the plane exposed at second side wall SW2 can be substantially equivalent to each other. It should be noted that FIG. 14 illustrates that the opening directions of first side wall SW1 and second side wall SW2 are all at the Si plane side, but may be all at the C plane side.

As the isotropic etching, thermal etching is suitable which is performed in an atmosphere including a reactive gas having at least one or more types of halogen atom. In this thermal etching, the at least one or more types of halogen atom include at least one of chlorine (Cl) atom and fluorine (F) atom. For example, as the reactive gas, $Cl_2$, $BCl_3$, $SF_6$, or $CF_4$ can be used. For specific conditions of the thermal etching, a mixed gas of chlorine gas and oxygen gas is used as the reactive gas and the heat treatment temperature can be not less than 700° C. and not more than 1000° C., for example.

Here, a flow rate ratio of the chlorine gas to the oxygen gas ((chlorine gas flow rate)/(oxygen gas flow rate)) is preferably not less than 0.5 and not more than 4.0, and is more preferably not less than 1.0 and not more than 2.0. Moreover, the reactive gas may contain a carrier gas in addition to the chlorine gas and the oxygen gas. An exemplary, usable carrier gas is nitrogen ($N_2$) gas, argon gas, helium gas, or the like. When the heat treatment temperature is set at not less than 700° C. and not more than 1000° C. as described above, a rate of etching silicon carbide (SiC) is approximately, for example, 70 μm/hr. Further, when using silicon oxide ($SiO_2$) as mask layer 40 in this case, a selection ratio of SiC to $SiO_2$ can be very large. Accordingly, mask layer 40 made of $SiO_2$ is not substantially etched during etching of SiC.

In the thermal etching described above, angle θ1 and angle θ2 can be more than 65° and not more than 80° by appropriately adjusting time taken for the etching. On this occasion, angle θ1 and angle θ2 are preferably more than 70° and not more than 80°, and more preferably, more than 72° and not more than 80°.

It should be noted that in order to facilitate to control angle θ1 and angle θ2 to fall in the above-described range, removal depth (d1 in FIG. 13 and FIG. 14) attained by the first etching (anisotropic etching) is preferably deeper than removal depth (d2 in FIG. 14) attained by the second etching (isotropic etching).

Figure 15:
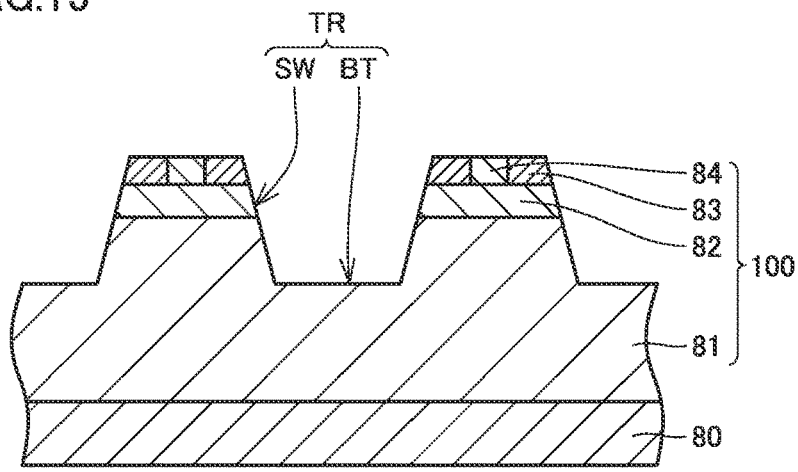
FIG. 15 is a partial cross sectional view schematically showing part of the process of manufacturing the silicon carbide semiconductor device according to the one embodiment of the present invention.

As described above, with step S1 to step S3, trench TR can be provided such that the opening directions of side walls SW facing each other are all at the same side in main surface MP of silicon carbide off substrate 101 and substantially equivalent planes are exposed at side walls SW facing each other. It should be noted that mask layer 40 can be removed by an appropriate method such as etching as shown in FIG. 15.
<Step S4>

Figure 16:
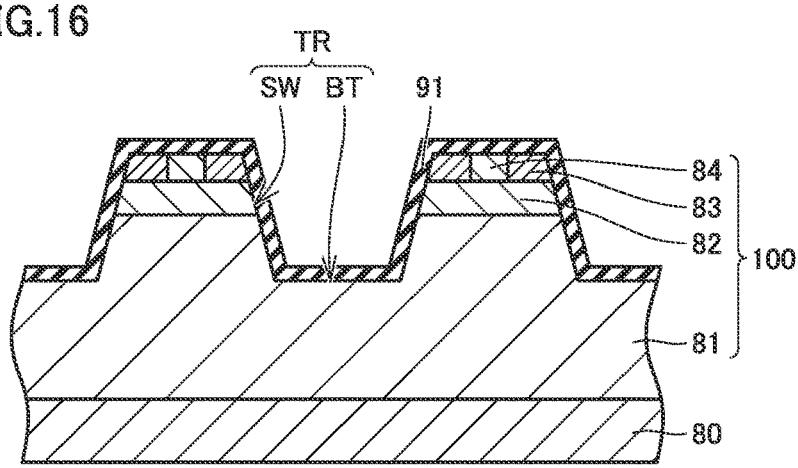
FIG. 16 is a partial cross sectional view schematically showing part of the process of manufacturing the silicon carbide semiconductor device according to the one embodiment of the present invention.

Next, with reference to FIG. 16, step S4 of forming gate insulating film 91 covering side walls SW and bottom portion BT of trench TR can be performed. Gate insulating film 91 can be formed by thermal oxidation, for example.
<Step S51>

As described above, in the present embodiment, the opening direction of each side wall SW (first side wall SW1 and second side wall SW2) may be at the Si plane side or the C plane side. Here, when the opening direction of each side wall SW is at the Si plane side, it is preferable to perform step S51 of introducing hydrogen into the interface between silicon carbide off substrate 101 and gate insulating film 91 after forming gate insulating film 91.

Specifically, it is preferable to perform heat treatment (hereinafter also referred to as "hydrogen annealing") using hydrogen ($H_2$) gas as atmospheric gas. As heat treatment conditions for the hydrogen annealing, for example, a heat treatment temperature can be set at not less than 1100° C. and not more than 1300° C. and heat treatment time can be set at about 1 hour. Accordingly, hydrogen can be introduced into the interface between silicon carbide off substrate 101 and gate insulating film 91. The introduction of hydrogen leads to suppression of formation of interface states at the interface between gate insulating film 91 and side wall SW having a characteristic similar to that of the C plane, thereby improving channel mobility in the semiconductor device. It should be noted that in this heat treatment, water vapor or oxygen gas containing water vapor can also be used as atmospheric gas instead of the hydrogen gas.
<Step S52>

Moreover, when the opening direction of each side wall SW is at the C plane side, it is preferable to perform step S52 of introducing nitrogen into the interface between silicon carbide off substrate 101 and gate insulating film 91 after forming gate insulating film 91.

Specifically, it is preferable to perform heat treatment (hereinafter, also referred as "nitrogen annealing") using nitrogen monoxide (NO) gas as atmospheric gas. As heat treatment conditions for the nitrogen annealing, for example, a heat treatment temperature can be set at not less than 1100° C. and not more than 1300° C. and heat treatment time can be set at about 1 hour. Accordingly, nitrogen can be introduced into the interface between silicon carbide off substrate 101 and gate insulating film 91. The introduction of nitrogen leads to suppression of formation of interface states at the interface between gate insulating film 91 and side wall SW having a characteristic similar to that of the Si plane, thereby improving channel mobility in the semiconductor device. It should be noted that in this heat treatment, instead of the NO gas, mixed gas of $N_2$ and $O_2$, $N_2O$ gas, or the like can be used as the atmospheric gas.

Moreover, heat treatment using inert gas may be performed after the hydrogen annealing or the nitrogen annealing. For example, heat treatment (hereinafter, also referred to as "Ar annealing") may be performed under Ar gas atmosphere. The Ar annealing is preferably performed at a heat treatment temperature that is higher than the heating temperature in the above-described hydrogen annealing or nitrogen annealing and that is lower than the melting point of gate insulating film 91. The heat treatment is performed for approximately 1 hour, for example. By performing Ar annealing, interface states can be further suppressed from being formed.

As shown in FIG. 17, after the steps described above, gate electrode 92 is formed on gate insulating film 91. Specifically, gate electrode 92 is formed on gate insulating film 91 so as to fill the region within trench TR with gate insulating film 91 interposed therebetween. Gate electrode 92 can be formed by, for example, forming a film of conductor or doped polysilicon and performing CMP (Chemical Mechanical Polishing).

Next, with reference to FIG. 18, interlayer insulating film 93 is formed on gate electrode 92 and gate insulating film 91 to cover the exposed surface of gate electrode 92. Next, etching is performed to form an opening in interlayer insulating film 93 and gate insulating film 91. N+ layer 83 and p contact region 84 are exposed through this opening. Then, source electrode 94 is formed in contact with each of n+ layer 83 and p contact region 84 thus exposed. Further, in single crystal layer 80, drain electrode 98 is formed on a backside surface opposite to the main surface side on which n drift layer 81 is formed.

Then, with reference to FIG. 1 again, source interconnection layer 95 is formed on source electrode 94. As described above, substantially equivalent planes are exposed at first side wall SW1 and second side wall SW2 of trench TR facing each other, thereby manufacturing a reliable silicon carbide semiconductor device. Moreover, in this manufacturing method, the position of trench TR does not depend on the off direction of silicon carbide off substrate 101. This leads to a high degree of freedom in design and high integration of silicon carbide semiconductor devices.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST 40, 61: mask layer; 60: resist film; 80: single crystal layer; 81: n drift layer; 82: p body layer; 83: n+ layer; 84: p contact region; 91: gate insulating film; 92: gate electrode; 93: interlayer insulating film; 94: source electrode; 95: source interconnection layer; 98: drain electrode; 100: silicon carbide layer; 101: silicon carbide off substrate; 201: silicon carbide semiconductor device; MP: main surface; TR, TQ: trench; SW: side wall; SW1: first side wall; SW2: second side wall; BT: bottom portion; θ, θ1, θ2: angle; d1, d2: depth.

The invention claimed is:

1. A silicon carbide semiconductor device comprising:
a silicon carbide off substrate including a main surface having an off angle relative to a basal plane, the main surface being provided with a trench, the trench having a plurality of side walls and a bottom portion;
a gate insulating film covering the side walls and the bottom portion; and
a gate electrode provided on the gate insulating film,
each of the side walls having an angle of more than 65° and not more than 80° relative to the basal plane in the trench,
opening directions of the plurality of side walls being all at a silicon plane side or a carbon plane side, wherein
the plurality of side walls include a first side wall and a second side wall facing each other, and
a difference between an angle of the first side wall relative to the basal plane and an angle of the second side wall relative to the basal plane is not more than the off angle.

2. The silicon carbide semiconductor device according to claim 1, wherein the silicon carbide off substrate has an off direction corresponding to a <11-20> direction.

3. The silicon carbide semiconductor device according to claim 1, wherein the off angle of the silicon carbide off substrate is not less than 1° and not more than 8°.

4. The silicon carbide semiconductor device according to claim 1, wherein when viewed in a plan view, the trench has a closed shape provided by the plurality of side walls continuous to one another, and all the side walls are covered with the gate insulating film.

5. The silicon carbide semiconductor device according to claim 1, wherein the opening directions of the plurality of side walls are all at the silicon plane side.

6. The silicon carbide semiconductor device according to claim 5, wherein a hydrogen concentration in a region within 10 nm from an interface between the silicon carbide off substrate and the gate insulating film is not less than $1\times10^{18}/cm^3$.

7. The silicon carbide semiconductor device according to claim 1, wherein the opening directions of the plurality of side walls are all at the carbon plane side.

8. The silicon carbide semiconductor device according to claim 7, wherein a nitrogen concentration in a region within 10 nm from an interface between the silicon carbide off substrate and the gate insulating film is not less than $1\times10^{18}/cm^3$.

9. The silicon carbide semiconductor device according to claim 1, wherein in a cross section passing through the center of the trench, parallel to the depth direction of the trench and not perpendicular to the off direction, a shape of the trench is asymmetrical.

10. A method for manufacturing a silicon carbide semiconductor device comprising:
a step of preparing a silicon carbide off substrate having a main surface;
a first etching step of performing anisotropic etching onto the main surface to form a trench having a plurality of side walls and a bottom portion; and
a second etching step of performing isotropic etching onto each of the side walls and the bottom portion to provide each of the side walls with an angle of more than 65° and not more than 80° relative to the basal plane, wherein
the plurality of side walls include a first side wall and a second side wall facing each other, and
a difference between an angle of the first side wall relative to the basal plane and an angle of the second side wall relative to the basal plane is not more than the off angle.

11. The method for manufacturing the silicon carbide semiconductor device according to claim 10, wherein removal depth of the silicon carbide off substrate attained by the first etching step is deeper than removal depth of the silicon carbide off substrate attained by the second etching step.

12. The method for manufacturing the silicon carbide semiconductor device according to claim 10, wherein the first etching step includes a step of etching the main surface to provide the side wall with an angle of not less than 80° relative to the basal plane.

13. The method for manufacturing the silicon carbide semiconductor device according to claim 10, wherein an opening direction of the side wall is at a silicon plane side, the method further comprising:
 a step of forming a gate insulating film covering the side wall and the bottom portion; and
 a step of introducing hydrogen into an interface between the silicon carbide off substrate and the gate insulating film.

14. The method for manufacturing the silicon carbide semiconductor device according to claim 10, wherein an opening direction of the side wall is at a carbon plane side, the method further comprising:
 a step of forming a gate insulating film covering the side wall and the bottom portion; and
 a step of introducing nitrogen into an interface between the silicon carbide off substrate and the gate insulating film.

15. The method for manufacturing the silicon carbide semiconductor device according to claim 10, wherein in a cross section passing through the center of the trench, parallel to the depth direction of the trench and not perpendicular to the off direction, a shape of the trench is asymmetrical.

* * * * *